United States Patent
Semler et al.

(10) Patent No.: US 12,046,504 B2
(45) Date of Patent: Jul. 23, 2024

(54) POSITIONAL ERROR COMPENSATION IN ASSEMBLY OF DISCRETE COMPONENTS BY ADJUSTMENT OF OPTICAL SYSTEM CHARACTERISTICS

(71) Applicant: KULICKE & SOFFA NETHERLANDS B.V., Eindhoven (NL)

(72) Inventors: Matthew R. Semler, Fargo, ND (US); Samuel Brown, West Fargo, ND (US); Rudolphus Hendrikus Hoefs, Eindhoven (NL)

(73) Assignee: KULICKE & SOFFA NETHERLANDS B.V., Eindhoven (NL)

( * ) Notice: Subject to any disclaimer, the term of this patent is extended or adjusted under 35 U.S.C. 154(b) by 235 days.

(21) Appl. No.: 17/617,717

(22) PCT Filed: Jun. 11, 2020

(86) PCT No.: PCT/US2020/037230
§ 371 (c)(1),
(2) Date: Dec. 9, 2021

(87) PCT Pub. No.: WO2020/252164
PCT Pub. Date: Dec. 17, 2020

(65) Prior Publication Data
US 2022/0236557 A1    Jul. 28, 2022

Related U.S. Application Data

(60) Provisional application No. 62/859,830, filed on Jun. 11, 2019.

(51) Int. Cl.
*H01L 21/683* (2006.01)
*G01B 11/27* (2006.01)
(Continued)

(52) U.S. Cl.
CPC ........ *H01L 21/6835* (2013.01); *G01B 11/272* (2013.01); *G02B 26/0816* (2013.01);
(Continued)

(58) Field of Classification Search
CPC .. G01B 11/272; G02B 26/0816; G02B 26/10; G02B 27/0025; H01L 21/67121;
(Continued)

(56) References Cited

U.S. PATENT DOCUMENTS 6,191,952 B1    2/2001 Jimarez et al.
6,949,462 B1 *  9/2005 Yang ................... G03F 7/70633
                                                  438/650
(Continued)

FOREIGN PATENT DOCUMENTS

CN    103597589    2/2014
CN    107768499    3/2018
(Continued)

OTHER PUBLICATIONS

Islam et al. "Measurement of the Temperature Dependent Constitutive Behavior of Underfill Encapsulants,"IEEE Trans. Compon. Packaging Manuf. Technol., Sep. 2005, 28(3): 467-476.
(Continued)

*Primary Examiner* — Tri T Ton
(74) *Attorney, Agent, or Firm* — Fish & Richardson P.C.

(57) ABSTRACT

A method includes determining an alignment error between a discrete component of a discrete component assembly mounted in a laser-assisted transfer system and a target position on a target substrate, the discrete component assembly including the discrete component adhered to a support by a dynamic release layer; based on the alignment error, determining a beam offset characteristic; and providing a signal indicative of the beam offset characteristic to an optical element of the laser-assisted transfer system, the
(Continued)

optical element being configured to adjust a position of a beam pattern relative to the discrete component according to the beam offset characteristic.

19 Claims, 5 Drawing Sheets

(51) Int. Cl.
| | |
|---|---|
| G02B 26/08 | (2006.01) |
| G02B 26/10 | (2006.01) |
| G02B 27/00 | (2006.01) |
| H01L 33/00 | (2010.01) |

(52) U.S. Cl.
CPC ......... *G02B 26/10* (2013.01); *G02B 27/0025* (2013.01); *H01L 21/6836* (2013.01); *H01L 33/005* (2013.01); *H01L 2221/68322* (2013.01); *H01L 2221/68368* (2013.01); *H01L 2221/68381* (2013.01)

(58) Field of Classification Search
CPC ......... H01L 21/67126; H01L 21/67132; H01L 21/67144; H01L 21/681; H01L 21/6835; H01L 2221/68318; H01L 2221/68363; H01L 33/005; H01L 21/6836; H01L 2221/68322; H01L 2221/68368; H01L 2221/68381
USPC ....................................................... 356/138
See application file for complete search history.

(56) References Cited

U.S. PATENT DOCUMENTS

| | | |
|---|---|---|
| 10,529,614 B2 | 1/2020 | Marinov |
| 2002/0149756 A1* | 10/2002 | Tokuda ............... G03F 7/70875 250/548 |
| 2005/0054121 A1 | 3/2005 | Handy et al. |
| 2007/0048891 A1 | 3/2007 | Hayashi et al. |
| 2010/0024725 A1 | 2/2010 | Lennon et al. |
| 2012/0115262 A1 | 5/2012 | Menard et al. |
| 2014/0238592 A1 | 8/2014 | Marinov et al. |
| 2018/0053750 A1 | 2/2018 | Kim et al. |
| 2019/0057891 A1 | 2/2019 | Marinov |
| 2020/0168498 A1 | 5/2020 | Marinov et al. |
| 2020/0328143 A1 | 10/2020 | Marinov |

FOREIGN PATENT DOCUMENTS

| | | |
|---|---|---|
| JP | 2001267368 | 9/2001 |
| JP | 2015067788 | 4/2015 |
| KR | 1020100115136 | 10/2010 |
| KR | 1020180021456 | 3/2018 |
| TW | 200623282 | 7/2006 |
| TW | 201909379 | 3/2019 |
| WO | WO2018231344 | 12/2018 |
| WO | WO2019147960 | 8/2019 |
| WO | WO2020061355 | 3/2020 |
| WO | WO2020117772 | 6/2020 |

OTHER PUBLICATIONS

Supplementary European Search Report in European Appln. No. 20822247.1, dated Jun. 21, 2022, 10 pages.
Supplementary European Search Report in European Appln. No. 20822619.1, dated Jun. 27, 2022, 9 pages.
Costa et al., "Prognostic Value of Serum Neurofilaments Inpatients with Clinically Isolated Syndromes", Neurology, Jan. 2019, 92(7):e733-e741.
Costa et al., "Serum Neurofilament Light Chain Levels are Increased at the Onset of PML in Natalizumab Treated MS Patients", 70th Annual Meeting of the American Academy of Neurology, Apr. 2018, 1 page.
Costa et al., "Serum Neurofilament Light Chain Levels are Increased at the Onset of PML in Natalizumab-Treated MS Patients", 4th Congress of the European Academy of Neurology (European Journal of Neurology), Jun. 2018, p. 327.
Fitzner et al., "Molecular Biomarkers in Cerebrospinal Fluid of Multiple Sclerosis Patients", Autoimmunity Reviews, Oct. 2015, 14(10):903-913.
PCT International Preliminary Report on Patentability in International Appln. No. PCT/US2020/017600, dated Aug. 26, 2021, 8 pages.
PCT International Search Report and Written Opinion in International Appln. No. PCT/US2020/017600, dated May 26, 2020, 15 pages.
PCT International Preliminary Report on Patentability in International Appln. No. PCT/US2020/037227, dated Dec. 23, 2021, 11 pages.
PCT International Preliminary Report on Patentability in International Appln. No. PCT/US2020/037230, dated Dec. 23, 2021, 10 pages.
PCT International Search Report and Written Opinion in International Appln. No. PCT/US2020/037227, dated Sep. 23, 2020, 15 pages.
PCT International Search Report and Written Opinion in International Appln. No. PCT/US2020/037230, dated Sep. 25, 2020, 15 pages.

* cited by examiner

POSITIONAL ERROR COMPENSATION IN ASSEMBLY OF DISCRETE COMPONENTS BY ADJUSTMENT OF OPTICAL SYSTEM CHARACTERISTICS

CLAIM OF PRIORITY

This application claims priority to U.S. Patent Application Ser. No. 62/859,830, filed on Jun. 11, 2019, the entire contents of which are hereby incorporated by reference.

BACKGROUND

This description relates generally to assembling discrete components onto a substrate.

SUMMARY

In an aspect, an assembly includes a substrate; a coating including a Bingham fluid disposed on a surface of the substrate; and a discrete component partially embedded in or disposed on the coating including the Bingham fluid.

Embodiments can include any one or more of the following features.

The Bingham fluid includes one or more of a flux, a solder paste, a conductive ink, a semiconducting ink, a gel, and a chemically inert material.

The discrete component includes a light emitting diode (LED).

The substrate includes a semiconductor wafer. The substrate includes a tape. The substrate includes a rigid substrate. The substrate includes a printed circuit board.

In an aspect, an assembly includes a substrate; and a coating including a Bingham fluid disposed on the substrate, a first surface of the coating contacting the substrate, in which the coating is configured such that when a discrete component is incident on a second surface of the coating opposite the first surface, the discrete component is disposed on or partially embedded in the coating.

Embodiments can include any one or more of the following features.

The Bingham fluid includes one or more of a flux, a solder paste, conductive ink, a semiconducting ink, a gel, and a chemically inert material. The Bingham fluid includes a conductive paste.

The substrate includes a printed circuit board.

In an aspect, a method includes irradiating a dynamic release structure disposed on a carrier, in which a discrete component is adhered to the dynamic release structure, the irradiating causing the discrete component to be released from the carrier; and receiving the released discrete component into or onto a coating disposed on a surface of a substrate, the coating including a Bingham fluid.

Embodiments can include any one or more of the following features.

Irradiating the dynamic release layer includes irradiating the dynamic release layer with laser energy.

The irradiating induces ablation of at least a portion of the dynamic release layer.

The method includes reducing an adhesion of the dynamic release layer prior to the irradiating.

Irradiating a dynamic release layer includes irradiating the dynamic release layer through the carrier.

The discrete component includes an LED.

The second substrate includes a tape. The second substrate includes a printed circuit board.

In an aspect, a method includes forming a coating on a surface of a target substrate, the coating including a Bingham fluid; and receiving a discrete component into or onto the coating, the discrete component having been transferred from a carrier by a laser-assisted transfer process.

In an embodiment, forming a coating including a Bingham fluid includes disposing one or more of a flux, a solder paste, conductive ink, a semiconducting ink, a gel, and a chemically inert material onto the surface of the target substrate.

In an aspect, a method includes determining an alignment error between a discrete component of a discrete component assembly mounted in a laser-assisted transfer system and a target position on a target substrate, the discrete component assembly including the discrete component adhered to a support by a dynamic release layer; based on the alignment error, determining a beam offset characteristic; and providing a signal indicative of the beam offset characteristic to an optical element of the laser-assisted transfer system, the optical element being configured to adjust a position of a beam pattern relative to the discrete component according to the beam offset characteristic.

Embodiments can include any one or more of the following features.

The method includes by the optical element, adjusting the position of the beam pattern relative to the discrete component according to the beam offset characteristic. The method includes adjusting the position of the beam pattern using a galvanometer laser scanner.

Determining an alignment error includes determining one or more of a magnitude of the alignment error and a direction of the alignment error.

Determining a beam offset characteristic includes determining an offset between a center of the discrete component and an offset position on the discrete component. Determining an offset includes determining one or more of a magnitude and a direction of the offset between the center of the discrete component and the offset position on the discrete component.

The method includes determining a beam offset characteristic to at least partially compensate for the alignment error. The method includes determining a beam offset characteristic such that when the beam pattern is incident on the discrete component assembly according to the beam offset characteristic, the discrete component is transferred to the target position on the substrate.

The method includes determining the alignment error using a machine vision system.

The method includes irradiating the dynamic release layer with the beam, the position of the beam pattern relative to the discrete component having been adjusted according to the beam offset characteristic, the irradiation causing the discrete component to be released from the carrier substrate.

The method includes receiving the discrete component at the target position on the target substrate.

In an aspect, a system includes a computing system including one or more processors coupled to a memory and configured to determine an alignment error between a discrete component of a discrete component assembly and a target position on a target substrate, the discrete component assembly including the discrete component adhered to a support by a dynamic release layer, the discrete component assembly being mounted in a laser-assisted transfer system; based on the alignment error, determine a beam offset characteristic; and provide a signal indicative of the beam offset characteristic to an optical element of the laser-assisted transfer system, the optical element being configured to adjust a position of a beam pattern relative to the discrete component according to the beam offset characteristic.

Embodiments can include any one or more of the following features.

The system includes the optical element. The optical element includes a galvanometer laser scanner.

Determining a beam offset characteristic includes determining an offset between a center of the discrete component and an offset position on the discrete component. Determining an offset includes determining one or more of a magnitude and a direction of the offset between the center of the discrete component and the offset position on the discrete component.

The one or more processors and memory are configured to determine a beam offset characteristic to at least partially compensate for the alignment error. The one or more processors and memory are configured to determine a beam offset characteristic such that when the beam pattern is incident on the discrete component assembly according to the beam offset characteristic, the discrete component is transferred to the target position on the substrate.

The one or more processors and memory implement a machine vision system.

DETAILED DESCRIPTION

We describe here approaches to address positional error in laser-assisted processes for transfer of discrete components from supports to target substrates. In some examples, a beam pattern incident on a discrete component assembly can be offset relative to a discrete component to be transferred to a target substrate. The offset of the beam pattern results in a placement error when the discrete component is transferred to the target substrate. The offset of the beam pattern can be tuned such that the placement error compensates for an alignment error between the target substrate and the discrete component assembly, thereby improving precision of the laser-assisted transfer process. The offset of the beam pattern can be performed by optical elements, providing rapid adjustment and enabling high throughput transfer to be achieved.

Figure 1A:
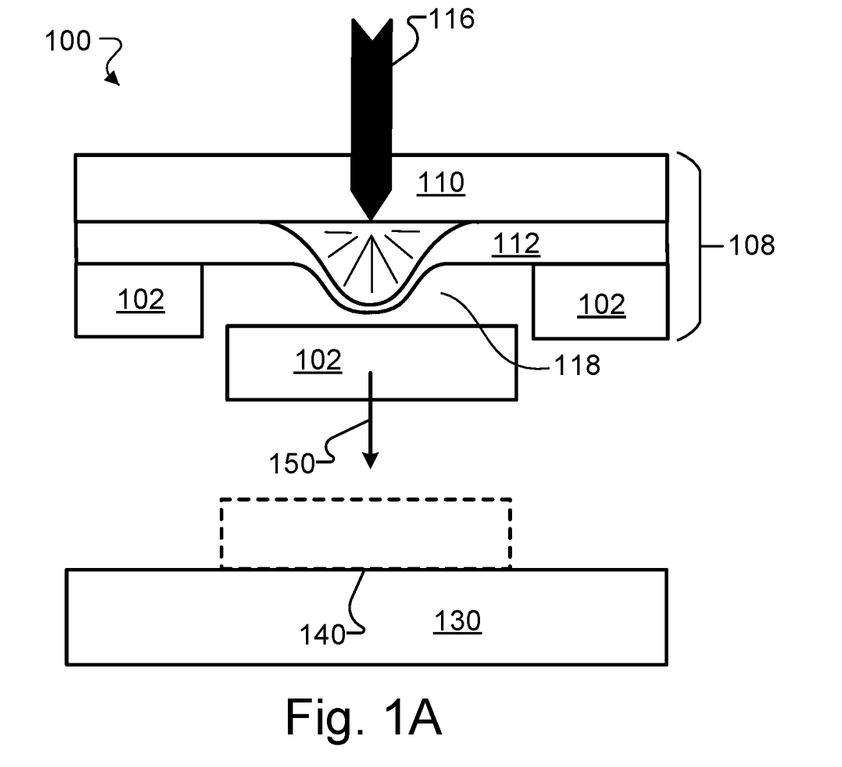
FIGS. 1A and 1B are diagrams of a laser-assisted transfer process.

FIG. 1A depicts a laser-assisted transfer process for high-throughput, low-cost contactless assembly of discrete components 102 onto a substrate 130. The term discrete component refers generally to, for example, any unit that is to become part of a product or electronic device, for example, electronic, electromechanical, photovoltaic, photonic, or optoelectronic components, modules, or systems, for example any semiconductor material having a circuit formed on a portion of the semiconducting material. In some examples, the discrete components can be light emitting diodes (LEDs). The discrete components can be ultra-thin, meaning having a maximum thickness of 100 µm or less, 50 µm or less, 40 µm or less, 30 µm or less, 25 µm or less, 20 µm or less, 10 µm or less, or 5 µm or less. The discrete components can be ultra-small, meaning having a maximum length or width dimension less than or equal to 300 µm per side, 100 µm per side, 50 µm per side, 20 µm per side, or 10 µm per side. The discrete components can be both ultra-thin and ultra-small.

In the laser-assisted transfer process, a discrete component assembly 108 is positioned in a component transfer system 100. The discrete component assembly 108 includes a support 110, with a dynamic release structure 112 disposed on a front side of the support 110. Discrete components 102 are adhered to the support 110 by the dynamic release structure 112. The support 110 can be a rigid support, such as a glass or rigid polymer substrate; or a flexible support, such as a tape. The dynamic release structure 112 can be a single layer structure or a multi-layer structure, such as a structure having two, three, four, or more than four layers.

In the laser-assisted transfer process, a back side of the support 110 is irradiated with radiation, such as laser light, e.g., a beam pattern 116. The beam pattern 116 can be a single beam (as shown) or a pattern of multiple beams, e.g., from a single light source or from multiple light sources. The support 110 is transparent to the wavelength of the radiation (e.g., the laser energy). An element that is transparent to a given wavelength is an element for which at least some radiation of the given wavelength passes through the element. The radiation passes through the support 110 and is incident on an area of the dynamic release structure 112, causing ablation of at least a partial thickness of the dynamic release layer in the area on which the laser beam pattern 116 is incident (which we refer to as the irradiated area). The ablation generates confined gas, which expands, generating a stress in the dynamic release structure 112. The stress causes at least some of the material of the dynamic release structure 112 to deform, forming one or more blisters 118. For instance, when the beam pattern 116 is a single beam, or a pattern of multiple, closely spaced beams, a single blister 118 is formed. When the beam pattern 116 includes multiple beams that are sufficiently spaced apart, a pattern of multiple blisters 118 is formed. Here, the term blister 118 refers generically to either a single blister or a pattern of multiple blisters.

The blister 118 exerts a mechanical force on the discrete component 102. When the mechanical force exerted by the blister 118 is sufficient to overcome the adhesion between the discrete component 102 and the dynamic release structure 112, the mechanical force exerted by the blister 118 (in combination with gravity) propels the discrete component away from the support 110 (e.g., in a downward direction) for transfer to a target substrate 130.

Further description of laser-assisted transfer processes can be found in U.S. Patent Publication No. US 2014/0238592, the contents of which are incorporated here by reference in their entirety.

Figure 1B:
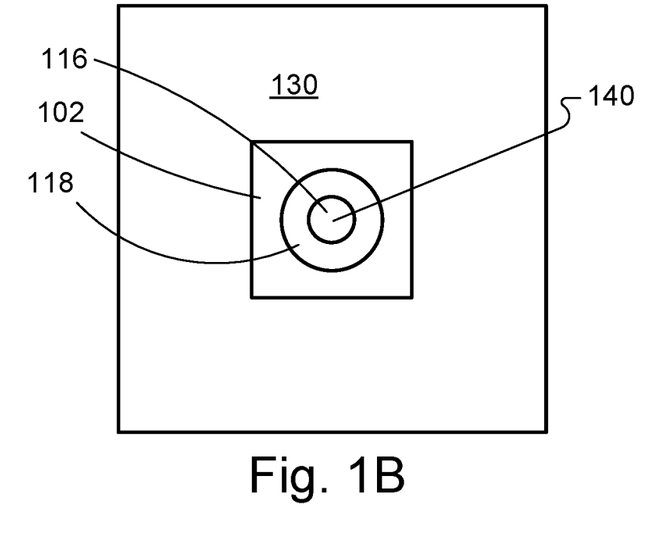

A transfer vector 150 indicates the direction of travel of the discrete component 102 upon its release from the support 110 and points to the ultimate placement of the discrete component 102 on the target substrate 130. The direction of the transfer vector 150 is a function of the position of the laser beam pattern 116 with respect to the discrete component 102. When the incident laser beam pattern 116 is centered with respect to the discrete component 102, as shown in FIGS. 1A and 1B, the resulting blister 118 (e.g., the single blister or the pattern of multiple blisters) is also centered with respect to the discrete component 102, and the transfer vector 150 is normal to the surface of the dynamic release structure 112 (referred to as a normal transfer vector). As a result, the discrete component 102 lands on the target substrate 130 at a position directly below the position of the discrete component 102 in the discrete component assembly 108.

An objective of the laser-assisted transfer process can be to transfer the discrete component 102 to a specific target position 140 on the target substrate 130. The target position 140 can be the position, on the target substrate 130, at which the center of the discrete component 102 is intended to be positioned. For instance, when the target substrate 130 is a device substrate, such as a printed circuit board, the target position 140 can be a position on the target substrate 130 at which interconnection elements, such as bond pads, will be aligned with interconnection elements on the discrete component 102.

To align the target position 140 on the target substrate 130 with the position of the discrete component 102 in the discrete component assembly 108, the target substrate 130 can be moved relative to the discrete component assembly 108, or the discrete component assembly 108 can be moved relative to the target substrate 130, or both. The relative movement can be implemented using a mechanical adjustment mechanism such as a linear translation stage, an actuator, or another suitable mechanical adjustment device. For instance, the coordinates, in a global x-y coordinate system, of the center of the discrete component 102 in the discrete component assembly 108 can be adjusted to match the global x-y coordinates of the target position.

The mechanical adjustment of the relative positioning of the discrete component assembly 108 and the target substrate 130 can sometimes be subject to error, such as deviations along the x-axis, the y-axis, or both, e.g., resulting from imprecision in the mechanical adjustment device. Such error can result in an alignment error between the x-y coordinates of the discrete component 102 and the x-y coordinates of the target position 140. Other sources of error can also contribute to an alignment error between the x-y coordinates of the discrete component 102 and the x-y coordinates of the target position 140, e.g., in addition to or instead of errors due to the mechanical adjustment. For instance, a difference between the expected position of the discrete component 102 in the discrete component assembly 108 and the actual position of the discrete component 102 in the discrete component assembly 108 can arise during prior processing, such as during singulation of the discrete components 102 or the placement of the discrete components 102 onto the support 110. If the x-y coordinate alignment between the target position 140 and the position of the discrete component 102 in the discrete component assembly 108 is based on the expected position of the discrete component 108, this difference resulting from prior processing can result in an alignment error between the x-y coordinates of the discrete component 102 and the x-y coordinates of the target position 140. In some examples, such alignment errors can be at least partially addressed by fine mechanical adjustment of the relative positions of the target substrate 130 and the discrete component assembly 108 prior to initiating the laser-assisted transfer process.

Figure 2A:
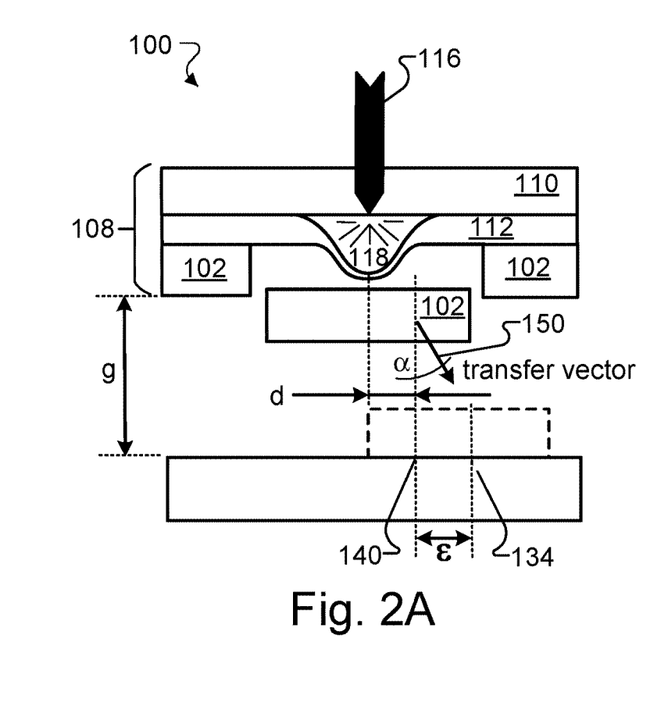
FIGS. 2A-2C are diagrams of a laser-assisted transfer process.
Figure 2B:
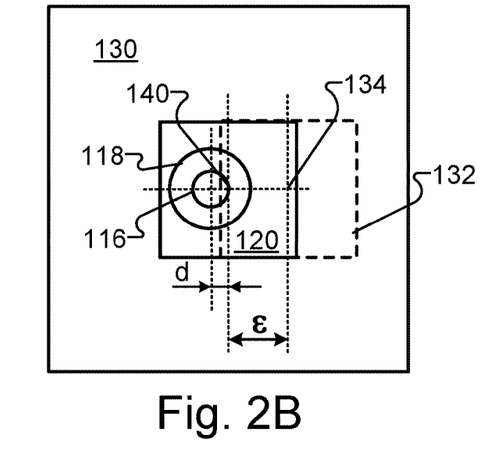
Figure 2C:
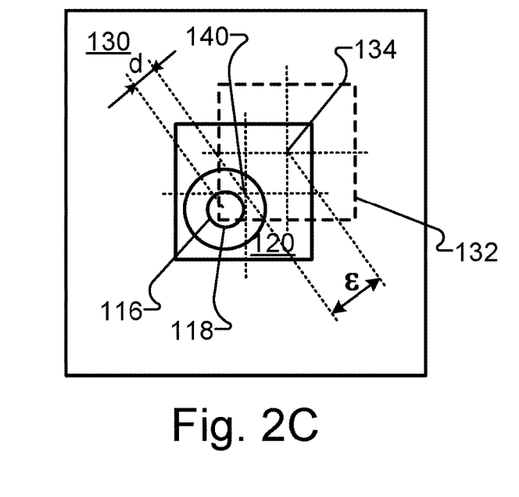

Referring to FIGS. 2A-2C, in some examples, the beam pattern 116 can be offset from the center of the discrete component 102 during the laser-assisted transfer process, meaning that the beam pattern 116 is incident at a position that is offset from a center of the discrete component. The offset of the beam pattern 116 can be used to at least partially compensate for the alignment error between the x-y coordinates of the discrete component 102 and the x-y coordinates of the target position 140.

When the beam pattern 116 is offset from (e.g., not centered on) the discrete component 102, the resulting blister 118 (e.g., the single blister or the pattern of multiple blisters) is also not centered with respect to the discrete component 102. This offset causes the transfer vector 150 to diverge from the surface normal by an angle α (referred to as an angled transfer vector). The angle α of the transfer vector 150 is related to the magnitude d and direction of the offset of the beam pattern 116 (sometimes referred to as the beam offset) from the center of the discrete component 102. With a normal transfer vector (e.g., as shown in FIG. 1A), the discrete component 102 would be transferred to the target position 140 that is directly below the position of the discrete component 102 in the discrete component assembly. The angled transfer vector causes the discrete component 102 to be transferred to an offset position 134 on the target substrate 130 that is shifted relative to the target position 140.

FIGS. 2B and 2C show top views of the discrete component assembly 108 with the attached discrete component 102, with the beam pattern 116 being offset from the center of the discrete component 102. The dashed boxes 132 depict the position of the discrete component 102 on the target substrate 130 following the transfer, with the dashed boxes being centered on the offset position 134. The distance between the target position 140 and the offset position 134 is the placement error ε induced by the offset of the beam pattern 116. The placement error ε can be along the x-axis, as shown in FIG. 2B; along the y-axis (not shown); can have a component along each of the x-axis and the y-axis, as shown in FIG. 2C.

The magnitude of the placement error ε is related to the magnitude d of the beam offset and the height g of a gap between a bottom surface of the discrete component 102 in the discrete component assembly 108 and a top surface of the target substrate 130. For instance, the magnitude d of the beam offset can have a direct linear relationship with the placement error ε given the gap height g. The spatial direction in which the transfer vector 150 points is opposite to the direction of the beam offset. For instance, in FIG. 2A, the beam pattern 116 is offset to the left of the figure while the transfer vector 150 points toward the right of the figure.

As discussed above, an alignment error can occur between the x-y coordinates of the discrete component 102 and the x-y coordinates of the target position 140. To compensate for such error, the beam pattern 116 can be purposely offset such that the placement error ε matches the alignment error between the x-y coordinates of the discrete component 102 and the x-y coordinates of the target position 140. Compensating for alignment error by introducing an offset to the beam pattern 116 can help to achieve precise alignment for the laser-assisted transfer process, and can enable rapid achievement of the alignment, thereby facilitating high throughput transfer processes.

Figure 3:
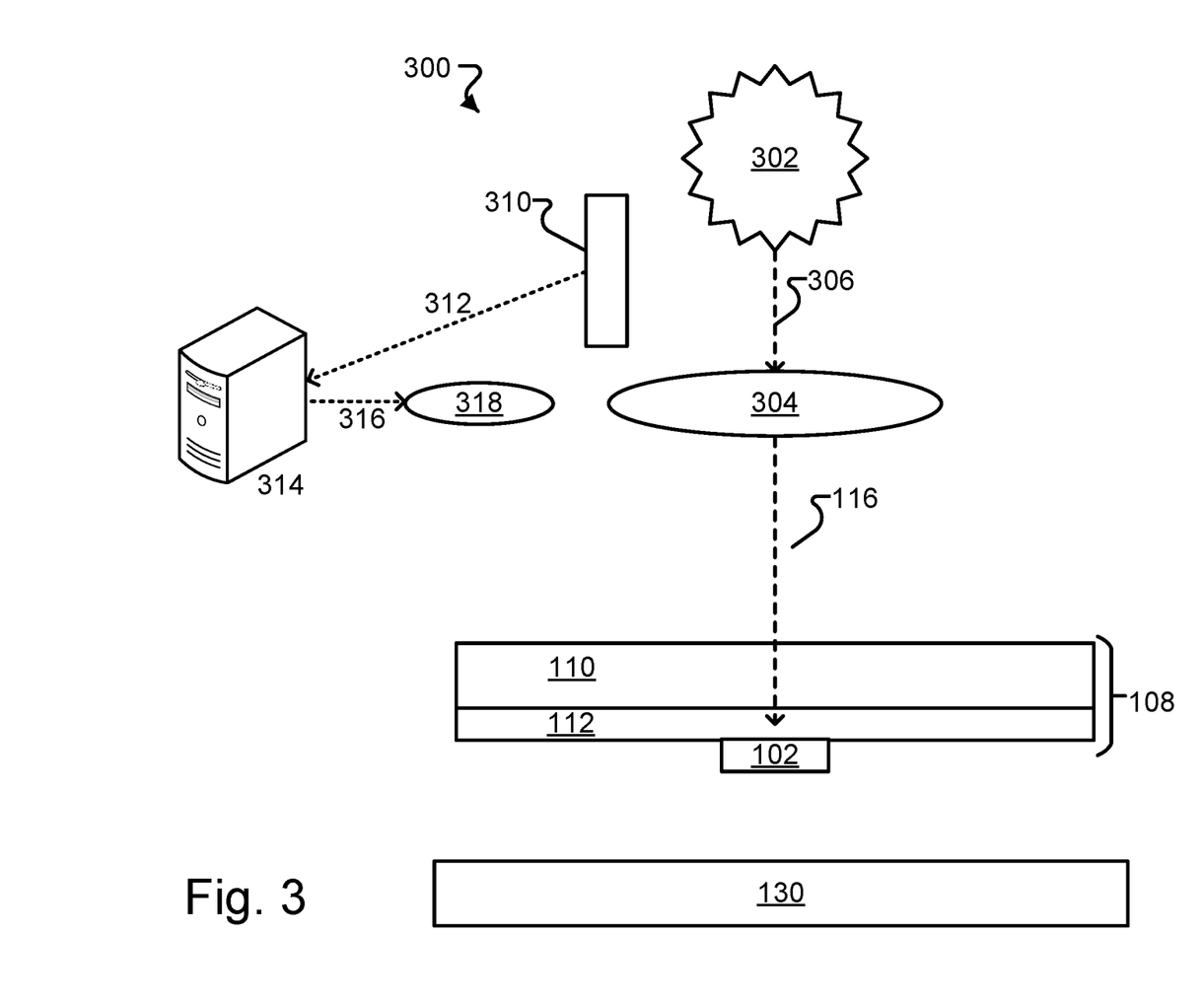
FIG. 3 is a diagram of a system for laser-assisted transfer.

In an example, referring to FIG. 3, an alignment error a (not shown) may be present between the x-y coordinates of the discrete component 102 and the x-y coordinates of the target position 140 in a laser-assisted transfer system 300. The alignment error a can be due to, e.g., imprecision in the mechanical alignment mechanism, positioning error of the discrete component 102 onto the support 110, or other reasons. To compensate for the alignment error, the beam pattern 116 can be offset to give rise to an angled transfer vector 150 that results in a placement error ε equal to the alignment error a. The discrete component 102 is then transferred directly to its target position 140, despite the alignment error a between the x-y coordinates of the discrete component 102 in the discrete component assembly 108 and the x-y coordinates of the target position 140.

The laser-assisted transfer system 300 includes a light source 302, such as a laser. A light beam 306 from the light source 302 can be incident on one or more optical elements 304, such as lenses, diffractive optical elements (e.g., beam splitters), that can form the light beam 306 from the light source 302 into the beam pattern 116. The beam pattern 116 can be a single beam of light (as shown) or can include multiple beamlets, which are beams of light that have a smaller size (e.g., diameter) than the light beam 306.

A light detector 310, such as a camera, is positioned to capture images of the relative positions of the discrete component 102 and the target position 140 on the target substrate 130. Images 312 from the light detector 310 are provided to a computing system 314 including one or more processors coupled to a memory and configured to process the images 312 to determine the alignment error a. For instance, the computing system 312 can implement a machine vision approach to identify the discrete component 102 and the target position 140 and to determine the magnitude and direction of the separation between a center of the discrete component 102 and the target position 140.

Based on the alignment error a, the computing system 312 determines a beam offset characteristic for the beam pattern 116 such that when the beam pattern 116 is offset by the beam offset characteristic, the discrete component 102 will be transferred to the target position 140. The beam offset characteristic indicates the magnitude d of the beam offset and the direction of the beam offset. In some examples, the beam offset characteristic can indicate other parameters, such as a number or arrangement of beamlets in the beam pattern 116.

The computing system 314 provides a signal 316 indicative of the beam offset characteristic to the laser-assisted transfer system 300, e.g., to control one or more optical elements 318 to adjust the position of the beam pattern 116 according to the beam offset characteristic. In an example, the one or more optical elements 318 can be a scanner, such as a galvanometer laser scanner, that can adjust the position of the beam pattern 116.

By implementing the beam offset characteristic by a scanner, compensation for the alignment error can be achieved quickly, enabling the transfer time per discrete component to be low and thus increasing the throughput of the laser-assisted transfer process.

Figure 4:
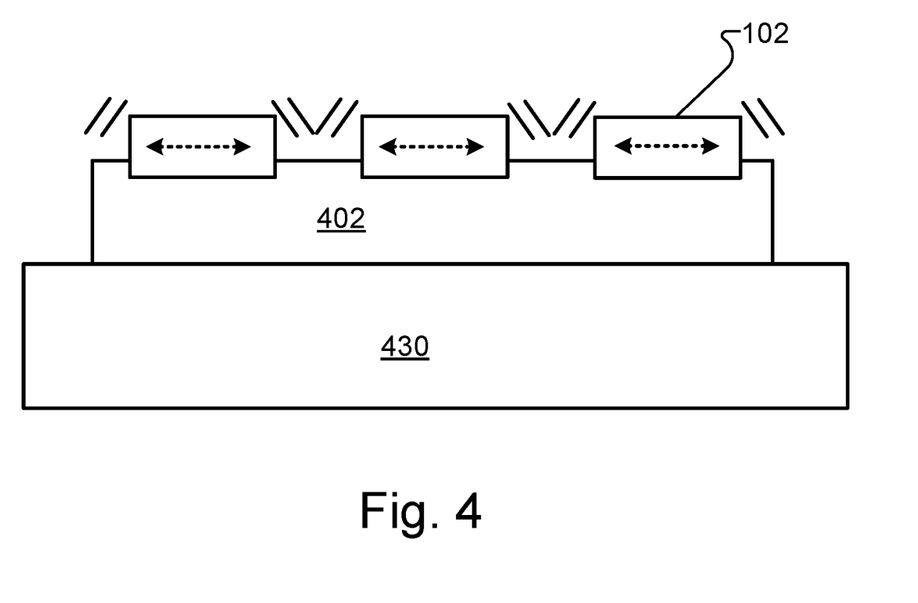
FIG. 4 is a diagram of a discrete component and a target substrate.

Referring to FIG. 4, in some examples, a target substrate 430 that receives a discrete component 102 in a laser-assisted transfer process can include a coating including a die catching material 402 disposed on its surface. The die catching material (DCM) 402 can be a material that receives discrete components as they are transferred from the carrier substrate and keeps them in their targeted positions while reducing post-transfer movement of the discrete components on the target substrate. We sometimes refer to the process of receiving of discrete components and keeping them in their targeted positions as catching the discrete components. The DCM can be a viscous fluid that slows the speed of the discrete component 102 when the discrete component 102 is incident on the coating 402.

In some cases, once a discrete component 102 has been caught by the DCM of the coating 402, the discrete component 102 can "float" in the coating. Floating of a discrete component 102 is the slow motion shifting of the discrete component 102 from its original placement position by an arbitrary distance. Floating can be caused by surface tension, thermal drift, leveling of the fluid after component impact, Brownian motion, or other factors, or a combination of multiple factors. Floating of a received discrete component can be undesirable, e.g., in that floating can contribute to overall placement error in the transfer process. For instance, component floating may cause the placement error to exceed established criteria thereby rendering the placed discrete component unusable for its intended application. In some examples, such as in applications involving tightly spaced discrete components, component floating may cause an incoming discrete component to make contact with a previously placed discrete component, thereby adding further placement error to the previously placed discrete component or creating other undesirable characteristics in the set of discrete components.

In some examples, the rheological properties of the DCM of the coating 402 can be tuned for a specific application, e.g., for a discrete component of a specific size or mass, to improve the accuracy and reliability of the laser-assisted transfer process.

Figure 5A:
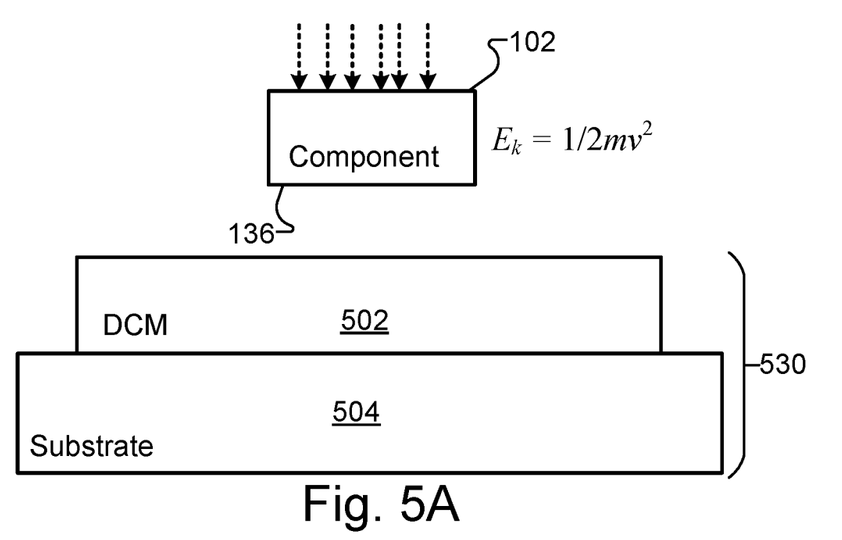
FIGS. 5A-5C are diagrams of a laser-assisted transfer process.
Figure 5B:
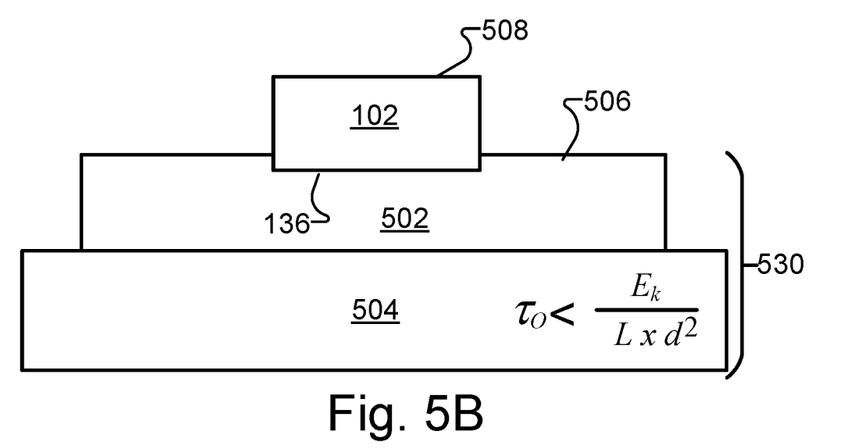

Referring to FIGS. 5A and 5B, in some examples, a target substrate 530 includes a coating 502 including a Bingham fluid disposed on a surface of a substrate 504. A Bingham fluid is a viscoplastic material that behaves as a rigid body at low stress but flows as a viscous fluid at and above its yield stress. Bingham fluids are also sometimes referred to as Bingham liquids, Bingham plastics, structured liquids, or viscoplastic solids. The Bingham fluid can include a gel (e.g., alcogels, hydrogels, organogels, or other types of gels), a synthetic polymer, a tacky paste, a flux, a solder paste, a suspension, a conductive or a semiconductive ink (e.g., an organic ink), a chemically inert material, or a combination of any two or more of them.

When a discrete component 102 is transferred to the target substrate 530 in a laser-assisted transfer process, the discrete component 102 is caught by the coating 502 including the Bingham fluid and is partially embedded into the coating (as shown in FIG. 5B) or disposed on top of the coating. By partially embedded, we mean that the bottom surface 136 of the discrete component 102 is below a top surface 506 of the coating 502, while a top surface 508 of the discrete component 102 is above the top surface 506 of the coating 502. Once the discrete component 102 is partially embedded in the coating 502, the rheological characteristics of the Bingham fluid prevent the discrete component 102 from spontaneously shifting its position or floating. The component placement precision and accuracy can thus be enhanced through the use of a coating including a Bingham fluid as a die catching material.

The substrate 504 can be a tape, such as a wafer tape. The substrate 504 can be a rigid substrate, such as a glass substrate or a semiconductor substrate. The substrate 504 can be a device substrate such as a printed circuit board (PCB). In some examples, the substrate 504 can be a semiconductor substrate, such as a semiconductor wafer or portion thereof, intended for use in multi-chip stacks.

Figure 5C:
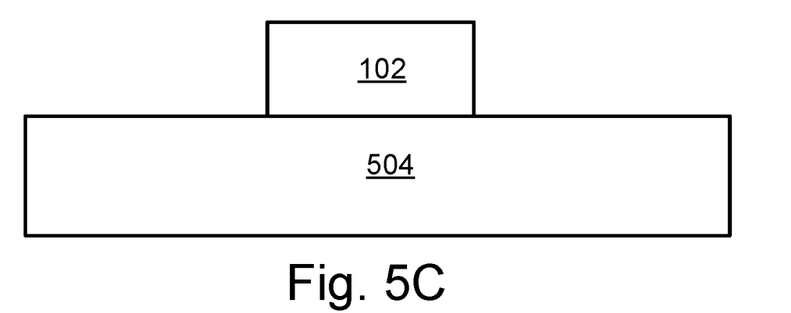

When the substrate 504 is a device substrate, the coating 502 including a Bingham fluid can facilitate interconnection of the discrete component 102 to electrical contacts, such as bond pads, on the substrate 504. For instance, the coating 502 including the Bingham fluid can be a conductive paste, such as a conductive solder paste. Referring to FIG. 5C, in some examples, a processing step can be carried out after the laser-assisted transfer of the discrete component 102 to bring the bottom surface 136 of the discrete component 102 into contact with electrical contacts on the substrate 504. In an example, the coating 502 including the Bingham fluid can be a solder flux that is removed during a soldering process. In an example, the assembly of the substrate 504 with the discrete component 102 partially embedded into the coating 502 is subjected to pressure, e.g., from a thermode, which squeezes out the Bingham fluid from between the discrete component 102 and the substrate 504, thereby enabling electrical contact between the discrete component 102 and the substrate 504.

A number of embodiments have been described. Nevertheless, it will be understood that various modifications may be made without departing from the spirit and scope of the disclosure. For example, some of the steps described above may be order independent, and thus can be performed in an order different from that described.

Other implementations are also within the scope of the following claims.

What is claimed is:

1. A method comprising:
    determining an alignment error between a discrete component of a discrete component assembly mounted in a laser-assisted transfer system and a target position on a target substrate, the discrete component assembly comprising the discrete component adhered to a support by a dynamic release layer;
    based on the alignment error, determining a beam offset characteristic; and
    providing a signal indicative of the beam offset characteristic to an optical element of the laser-assisted transfer system, the optical element being configured to adjust a position of a beam pattern relative to the discrete component according to the beam offset characteristic.

2. The method of claim 1, comprising by the optical element, adjusting the position of the beam pattern relative to the discrete component according to the beam offset characteristic.

3. The method of claim 2, comprising adjusting the position of the beam pattern using a galvanometer laser scanner.

4. The method of claim 1, in which determining an alignment error comprises determining one or more of a magnitude of the alignment error and a direction of the alignment error.

5. The method of claim 1, in which determining a beam offset characteristic comprises determining an offset between a center of the discrete component and an offset position on the discrete component.

6. The method of claim 5, in which determining an offset comprises determining one or more of a magnitude and a direction of the offset between the center of the discrete component and the offset position on the discrete component.

7. The method of claim 1, comprising determining a beam offset characteristic to at least partially compensate for the alignment error.

8. The method of claim 7, comprising determining a beam offset characteristic such that when the beam pattern is incident on the discrete component assembly according to the beam offset characteristic, the discrete component is transferred to the target position on the substrate.

9. The method of claim 1, comprising determining the alignment error using a machine vision system.

10. The method of claim 1, comprising irradiating the dynamic release layer with the beam, the position of the beam pattern relative to the discrete component having been adjusted according to the beam offset characteristic, the irradiation causing the discrete component to be released from the carrier substrate.

11. The method of claim 10, comprising receiving the discrete component at the target position on the target substrate.

12. A system comprising:
    a computing system comprising one or more processors coupled to a memory and configured to:
        determine an alignment error between a discrete component of a discrete component assembly and a target position on a target substrate, the discrete component assembly comprising the discrete component adhered to a support by a dynamic release layer, the discrete component assembly being mounted in a laser-assisted transfer system;
        based on the alignment error, determine a beam offset characteristic; and
        provide a signal indicative of the beam offset characteristic to an optical element of the laser-assisted transfer system, the optical element being configured to adjust a position of a beam pattern relative to the discrete component according to the beam offset characteristic.

13. The system of claim 12, comprising the optical element.

14. The system of claim 13, in which the optical element comprises a galvanometer laser scanner.

15. The system of claim 12, in which determining a beam offset characteristic comprises determining an offset between a center of the discrete component and an offset position on the discrete component.

16. The system of claim 15, in which determining an offset comprises determining one or more of a magnitude and a direction of the offset between the center of the discrete component and the offset position on the discrete component.

17. The system of claim 12, in which the one or more processors and memory are configured to determine a beam offset characteristic to at least partially compensate for the alignment error.

18. The system of claim 17, in which the one or more processors and memory are configured to determine a beam offset characteristic such that when the beam pattern is incident on the discrete component assembly according to the beam offset characteristic, the discrete component is transferred to the target position on the substrate.

19. The system of claim 17, in which the one or more processors and memory implement a machine vision system.

* * * * *